US005623199A

United States Patent [19]
Taniguchi et al.

[11] Patent Number: 5,623,199
[45] Date of Patent: Apr. 22, 1997

[54] DEVICE FOR INSPECTING WIRING HARNESS

[75] Inventors: Yoshikazu Taniguchi; Katsutoshi Kato, both of Yokkaichi, Japan

[73] Assignee: Sumitomo Wiring Systems, Ltd., Japan

[21] Appl. No.: 558,699

[22] Filed: Nov. 16, 1995

[30] Foreign Application Priority Data

Nov. 28, 1994 [JP] Japan .................................. 6-292739

[51] Int. Cl.$^6$ ............................ G01R 31/02; G01R 19/00
[52] U.S. Cl. ............................ 324/66; 324/538; 324/539
[58] Field of Search ........................ 324/538, 539, 324/542, 66; 364/483

[56] References Cited

U.S. PATENT DOCUMENTS

| | | | |
|---|---|---|---|
| 2,953,744 | 9/1960 | Miller et al. | 324/66 |
| 4,030,029 | 6/1977 | Cox | 324/66 X |
| 4,218,745 | 8/1980 | Perkins | 324/66 X |
| 4,257,002 | 3/1981 | Helms et al. | 324/66 |
| 4,620,282 | 10/1986 | Shelley | 324/66 X |
| 4,859,953 | 8/1989 | Young et al. | 324/66 X |
| 4,928,066 | 5/1990 | Adlon et al. | 324/66 X |

*Primary Examiner*—Kenneth A. Wieder
*Assistant Examiner*—Diep Do
*Attorney, Agent, or Firm*—Jordan B. Bierman; Bierman and Muserlian

[57] ABSTRACT

An inspecting device body (1) including an input terminal group (23), an output terminal group (24), a connection terminal group (25), a signal output portion (38), a signal input portion (39), first and second memory portions (40, 41), a comparing and determining portion (42), a lighting and flashing drive portion (44), and a control portion (48) is electrically connected to a work table (2) including an input connector (4), an output connector (5), LEDs (6), an earth plate (7) by one flexible printed wiring board (9), thereby reducing the rejection rate of wiring harnesses at assembly on an assembly line, allowing the final inspection of the wiring harnesses for acceptance or rejection, and improving assembly efficiency.

6 Claims, 8 Drawing Sheets

DEVICE FOR INSPECTING WIRING HARNESS

BACKGROUND OF THE INVENTION

1. Field of the Invention

The present invention relates to a device for inspecting a wiring harness to be inspected having a pair of connectors mounted on its opposite ends for correct connection. More particularly, the invention relates to a device having three modes of function: a storage mode wherein reference data are stored which represent connection specifications between cables of a model wiring harness and pins of first and second connectors on opposite ends of the model wiring harness; an indication mode wherein a target wiring harness including cables having a first end on which a first connector is mounted and a second end connected to only terminals is provided, and an indication of connections between pins of a second connector and the terminals on the second end of the target wiring harness is given on the basis of the reference data; and an inspection mode wherein a wiring harness to be inspected is provided by making the connections between the pins of the second connector and the terminals on the second end in accordance with the indication in the indication mode, and an inspection is carried out for matching between the connection specifications of the model wiring harness and the connections between the cables of the wiring harness to be inspected and the pins of the first and second connectors on the first and second ends of the cables.

2. Description of the Background Art

A conventional wiring harness inspecting device for inspecting a wiring harness to be inspected with connectors mounted on its opposite ends for correct connection is disclosed, for example, Japanese Patent Application Laid-Open No. 61-176868 (1986). This device is adapted to store, in a memory portion, reference data representative of connection specifications between cables of a model wiring harness and pins of connectors on opposite ends of the cables, to compare inspection data indicative of the connections between cables of a wiring harness to be inspected and pins of connectors mounted on the opposite ends of the cables with the reference data stored in the memory portion to examine whether or not the connections of wiring harness to be inspected matches the connection specifications of the model wiring harness, and then to display the pin number of the connectors which is defective if a connection failure occurs.

However, the above stated inspecting device inspects the wiring harness to be inspected with the opposite ends on which the connectors have already been mounted and is not used to aid in mounting the connectors. Thus, the use of such an inspecting device on an assembly line for wiring harnesses is impractical and does not lead to the reduction in rejection rate of the wiring harnesses on the assembly line.

Further, the wiring harnesses for automotive vehicles are very elongated. The inspection of such elongated wiring harnesses by the above stated device might result in the increased size of the device itself.

A device for aiding in assembling wiring harnesses is disclosed in Japanese Patent Application Laid-Open No. 64-72484 (1989). In this device, a plurality of light emitting points are arranged in the same pattern as an array of terminals for a connector housing, and the housing is placed on the light emitting pattern so that terminal receiving holes correspond to the light emitting pattern. A group of cores are inserted at their first end into another housing at random to form a connector which in turn is plugged in pins of the same arrangement as those of a connector to be connected in practical use. One pole of a DC power supply for lighting up the light emitting points is connected to the pins, and the other pole thereof is connected to a lead which in turn is brought into contact with a terminal at a second end of one of the group of cores to light the corresponding light emitting point, thereby indicating the terminal receiving hole into which the second-end terminal is to be inserted. This device contributes to the reduction in rejection rate at assembly, but requires another separate device for final inspection of the wiring harnesses for failure.

SUMMARY OF THE INVENTION

The present invention is intended for a wiring harness inspecting device for inspecting a plurality of terminals mounted on opposite ends of a plurality of cables of a wiring harness to be inspected for correct insertion into a plurality of corresponding terminal receiving holes of a connector. According to the present invention, the wiring harness inspecting device comprises: an inspecting device body, and a work table, the wiring harness inspecting device being operated in a storage mode, an indication mode, and an inspection mode, wherein, in the storage mode, there is provided a model wiring harness including a plurality of cables and a pair of model connectors mounted on opposite ends of the cables, and the insertion condition of terminals on opposite ends of the cables into terminal receiving holes of the pair of model connectors is stored as reference data, wherein, in the indication mode, there is provided a target wiring harness including a plurality of cables and a first connector mounted on a first end of the cables, and an indication of insertion of terminals on a second end of the cables of the target wiring harness into terminal receiving holes of a second connector to be connected is given on the basis of the reference data, and wherein, in the inspection mode, the terminals on the second end of the cables of the target wiring harness are inserted into the terminal receiving holes of the second connector indicated in the indication mode to provide a wiring harness to be inspected, and an inspection is made on the basis of the reference data to see if the insertion condition of the cables of the wiring harness to be inspected into the terminal receiving holes of the first and second connectors on opposite ends of the cables matches the insertion condition of the model wiring harness, the inspecting device body including: an input terminal group having a plurality of input terminals; a signal output portion for outputting an inspection signal to the input terminals in order; an output terminal group having a plurality of output terminals; a signal input portion for receiving a signal through the output terminals; a connection terminal group having a plurality of connection terminals; a reference data memory portion for storing therein the reference data indicative of the insertion condition of the model wiring harness in the storage mode; a light emitting element lighting drive portion for outputting a lighting drive signal to a predetermined one of the connection terminals on the basis of the reference data in the indication mode; an inspection data memory portion for storing therein inspection data indicative of the insertion condition of the wiring harness to be inspected in the inspection mode; a comparing and determining portion for comparing the inspection data with the reference data in the inspection mode, the comparing and determining portion outputting an abnormal condition signal when a failure occurs in the inspection data; and a flashing drive portion for outputting a flashing drive signal to one of the connection terminals which corresponds to the failure portion in response to the abnormal condition signal in the inspection mode, the work table including: an input connector connected to the input terminals in the input terminal group of the inspecting device body, the input connector being connected to one of the model connectors of the model wiring harness in the storage mode, to the first connector of the target wiring harness in the indication mode, and to the first connector of the wiring harness to be inspected in the inspection mode; an output connector connected to the output terminals in the output terminal group of the inspecting device body, the output connector being connected to the other model connector of the model wiring harness in the storage mode, and to the second connector of the wiring harness to be inspected in the inspection mode; a plurality of light emitting elements located adjacent respective terminal receiving holes of the output connector and connected to the connection terminals in the connection terminal group of the inspecting device body for flashing in response to the flashing drive signal in the inspection mode to indicate a failure and terminal insertion; and specifying means, upon selection of one of the terminals on the second end of the target wiring harness having the first connector connected to the input connector, for specifying one of the connection terminals to light up one of the light emitting elements adjacent the terminal receiving hole in the reference data which corresponds to the selected terminal.

According to the present invention, as above described, an electrical connection is established between the inspecting device body and the work table which are separately provided. For example, when there are a plurality of wiring harness assembly lines, a plurality of work tables may be located in suitable positions on the respective assembly lines and the inspecting device body may be connected to only the work table on the required assembly line, thereby reducing the rejection rate of the wiring harnesses at assembly on the assembly line, allowing the final inspection of the wiring harnesses for acceptance or rejection, and reducing the size of the inspection device body itself. The wiring harness inspecting device according to the present invention exhibits its applicability particularly when the plurality of assembly lines are provided for the wiring harnesses and further improves the operation efficiency on the assembly lines for the wiring harnesses.

It is therefore an object of the present invention to provide a device which is capable of conducting a final inspection of wiring harnesses for failure as well as reducing a rejection rate of the wiring harnesses at assembly on an assembly line thereof to improve assembly efficiency.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
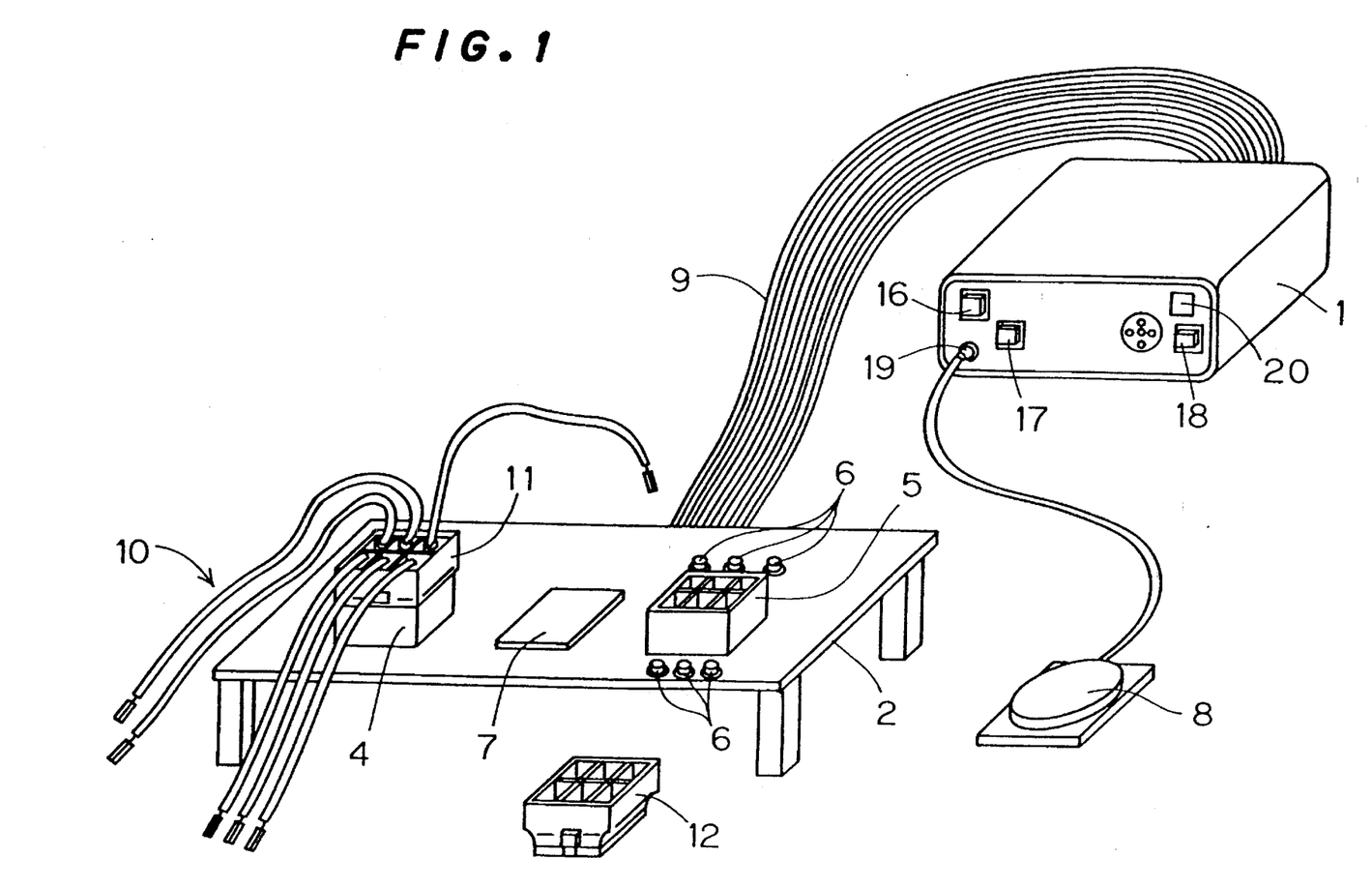
FIG. 1 is a schematic view of one preferred embodiment according to the present invention.

The general schematic construction of the preferred embodiment is described below with reference to FIG. 1. An inspecting device body 1 and a work table 2 are separately provided. The work table 2 comprises an input connector 4, an output connector 5, a plurality of light-emitting diodes (referred to hereinafter as LEDs) 6 located adjacent the respective terminal receiving holes of the output connector 5 and serving as light emitting elements for indication of failures and terminal insertion, and an earth plate 7 connected to a ground terminal of the input. connector 4 to form a specifying means. The input connector 4, output connector 5 and LEDs 6 are electrically connected to the inspecting device body 1 by a flexible printed wiring board 9.

A foot switch 8 for inspection start is connected to the inspecting device body 1. In the work table 2, first and second connectors of a model wiring harness (not shown in FIG. 1) on opposite ends thereof are connected to the input and output connectors 4 and 5, respectively, in a storage mode. In an indication mode, there is provided a target wiring harness 10 including cables having a first end on which a first connector 11 is mounted and a second end connected to only terminals as shown in FIG. 1. The first connector 11 on the first end of the target wiring harness. 10 is connected to the input connector 4, and a second connector 12 into which the terminals on the second end of tile cables of the target wiring harness 10 are to be inserted is connected to the output connector 5. In an inspection mode, a wiring harness to be inspected (not shown) is provided by inserting the terminals on the second end of the target wiring harness 10 into predetermined terminal receiving holes of the second connector 12 in accordance with the indication in the indication mode, and the connectors mounted on the first and second ends of the cables of the wiring harness to be inspected are connected to the input and output connectors 4 and 5, respectively.

Figure 2:
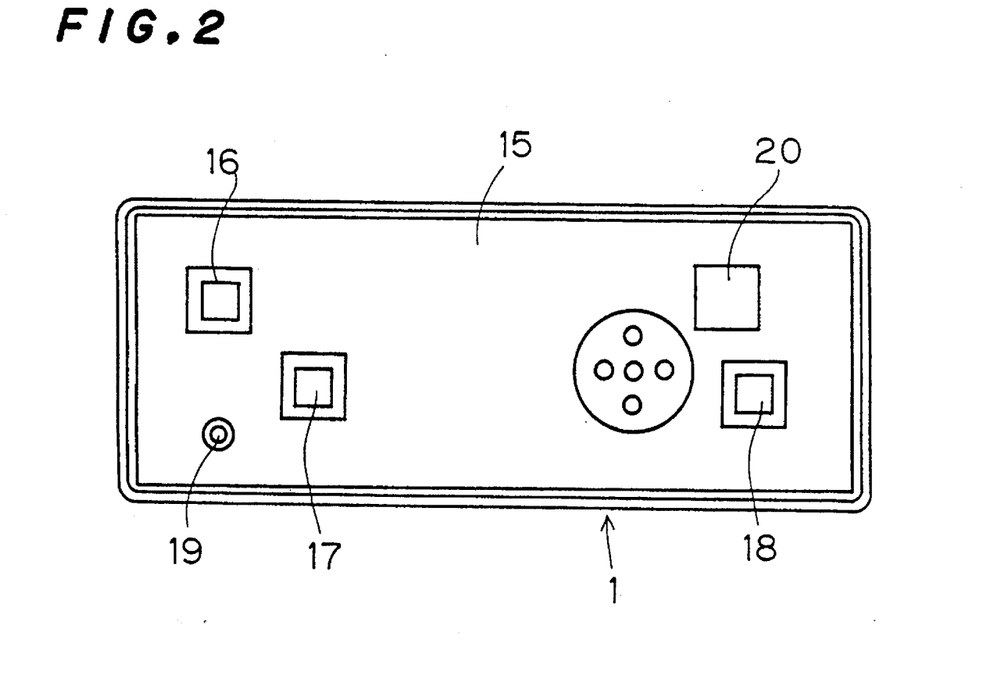
FIG. 2 is a fragmentary front elevation of the preferred embodiment.
Figure 3:
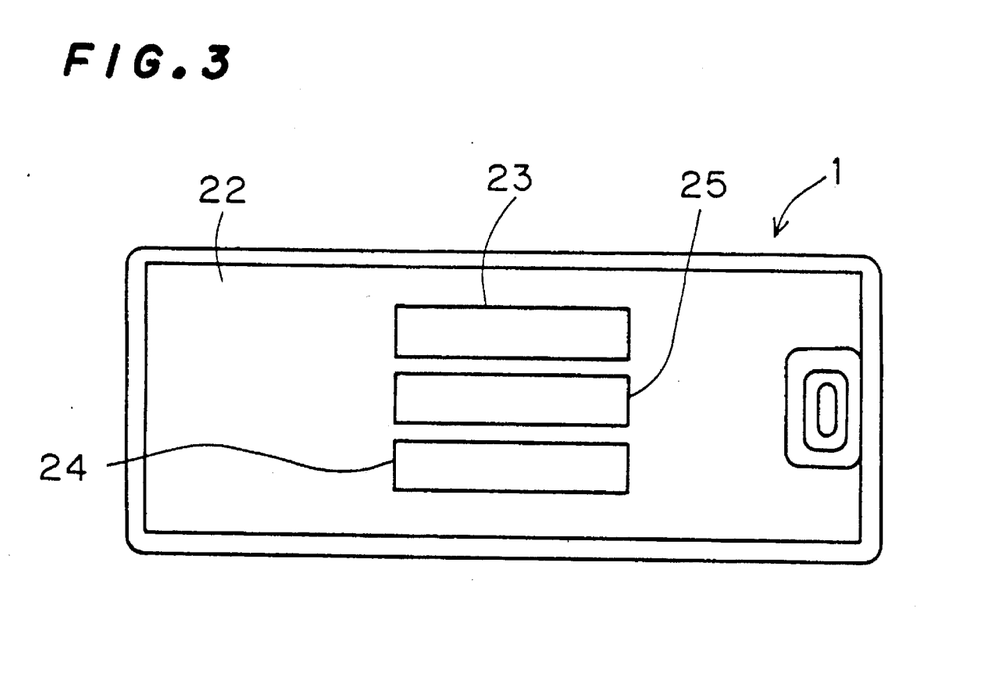
FIG. 3 is a fragmentary rear elevation of the preferred embodiment.

The construction of the inspecting device body 1 is discussed below. Referring to FIGS. 2 and 3, a front panel 15 of the device body 1 includes a power switch 16, a reset switch 17, a memory switch 18 to be manipulated in the storage mode, a jack 19 connected to the foot switch 8, and an acceptance LED 20 which lights up when the wiring harness to be inspected is acceptable as a result of the inspection.

A rear panel 22 of the device body 1 includes an input terminal group 23 comprised of, for example, 30 input and ground terminals, an output terminal group 24 comprised of, for example, 30 output terminals, and a connection terminal group 25 comprised of, for example, 30 connection and power supply terminals. The single flexible printed wiring board 9 establishes a connection between the input terminal group 23 and the input connector 4, a connection between the output terminal group 24 and the output connector 5, and a connection between the connection terminal group 25 and the LEDs 6.

Figure 4:
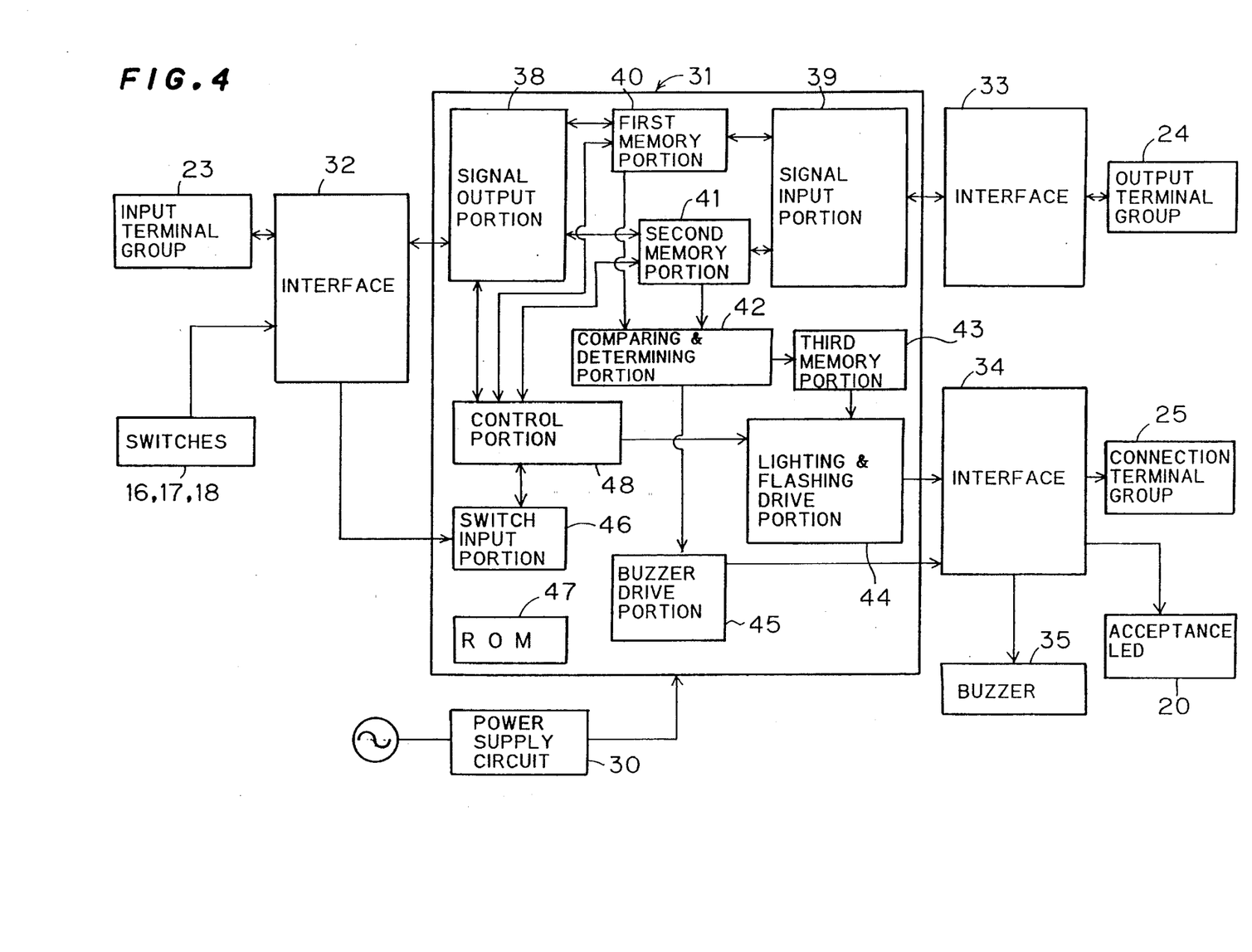
FIG. 4 is a fragmentary block diagram of the preferred embodiment.

The internal construction of the device body 1 is shown in FIG. 4. A power supply circuit 30 including an AC/DC converter connected to a commercial AC power supply is connected to a power supply terminal of a microcomputer 31. The input terminal group 23 is connected to the microcomputer 31 through an interface 32. The respective switches 16 to 18 are connected to the microcomputer 31 through the interface 32. The output terminal group 24 and the connection terminal group 25 are connected to the microcomputer 31 through interfaces 33 and 34, respectively. The acceptance LED 20 and an acceptance buzzer 35 operated when the wiring harness to be inspected is acceptable are connected to the microcomputer 31 through the interface 34.

The functional blocks of the microcomputer 31 are described below. As shown in FIG. 4, the microcomputer 31 comprises a signal output portion 38 for outputting a high-level inspection signal to the respective input terminals in the input terminal group 23 in order through the interface 32, a signal input portion 39 for receiving a signal through the output terminal group 24 and the interface 33, a first memory portion 40 including a RAM serving as a reference data storage portion for storing therein reference data indicative of the insertion condition of the model wiring harness in the storage mode, and a second memory portion 41 including a RAM serving as an inspection data storage portion for storing therein the insertion condition of the wiring harness to be inspected in the inspection mode.

With continued reference to FIG. 4, the microcomputer 31 further comprises a comparing and determining portion 42, a third memory portion 43, a light emitting element lighting and flashing drive portion 44, a buzzer drive portion 45, a switch input portion 46, a ROM 47, and a control portion 48. The comparing and determining portion 42 compares the inspection data in the second memory portion 41 with the reference data in the first memory portion 40 in the inspection mode to output a normal condition signal when no failure is detected in the inspection data and to output an abnormal condition signal corresponding to failure contents when a failure occurs therein. The third memory portion 43 includes a RAM for storing therein an output terminal number in the output terminal group 24 corresponding to a defective terminal among the terminals connected to the second connector of the wiring harness to be inspected when a failure occurs in the inspection data. The light emitting element lighting and flashing drive portion 44 outputs a low-level lighting drive signal to the corresponding connection terminal in the connection terminal group 25 through the interface 34 in response to the reference data in the indication mode and outputs a flashing drive signal having flashing patterns corresponding to the failure contents to the connection terminal corresponding to the failure portion in the connection terminal group 25 through the interface 34 in response to the abnormal condition signal in the inspection mode. The buzzer drive portion 45 outputs a buzzer drive signal to the acceptance buzzer 35 through the interface 34 in response to the normal condition signal from the comparing and determining portion 42. The switch input portion 46 receives operation signals from the respective switches 16 to 18 through the interface 32. The ROM 47 stores various control programs therein. The control portion 48 controls the respective portions.

The signal output portion 38 and control portion 48 as well as the earth plate 7 specify the connection terminals in the indication mode. More specifically, when one of the terminals on the second end of the target wiring harness 10 is selected and brought into contact with the earth plate 7, with the high-level inspection signal outputted from the signal output portion 38 to an associated one of the input terminals in the input terminal group in the reference data, then only the input terminal in the input terminal group 23 which is connected to the contacted terminal goes low and detected by the control portion 48. Then the control portion 48 specifies the LED 6 adjacent the terminal receiving hole of the output connector 5 which is connected to the output terminal in the output terminal group 24 having the corresponding terminal number in the reference data, and the connection terminal in the connection terminal group 25 which is connected to the LED 6. The specified connection terminal receives the lighting drive signal from the lighting and flashing drive portion 44.

Figure 5:
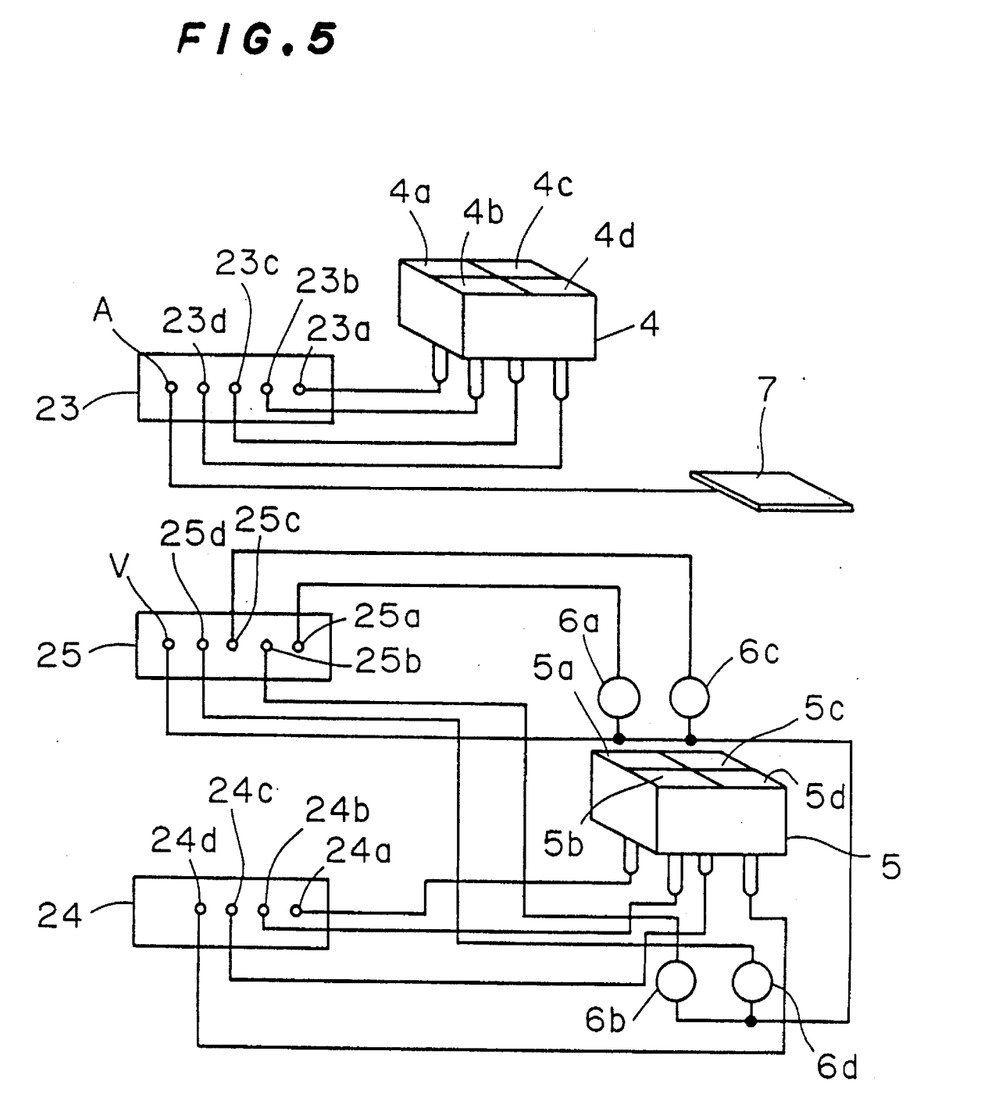
FIG. 5 illustrates connections of the preferred embodiment.

FIG. 5 illustrates an example of the connections between the respective terminal groups 23, 24, 25 of the device body 1 and the input and output connectors 4, 5 and LEDs 6 of the work table 2. It is now assumed that each of the input and output connectors 4, 5 has four terminal receiving holes. The terminals in terminal receiving holes 4a, 4b, 4c, 4d of the input connector 4 are connected respectively to first to fourth input terminals 23a, 23b, 23c, 23d in the input terminal group 23. The terminals in terminal receiving holes 5a, 5b, 5c, 5d of the output connector 5 are connected respectively to first to fourth output terminals 24a, 24b, 24c, 24d in the output terminal group 24. The earth plate 7 is connected to a ground terminal A in the input terminal group 23. First ends of LEDs 6a, 6b, 6c, 6d adjacent the terminal receiving holes 5a, 5b, 5c, 5d of the output connector 5 are connected respectively to first to fourth connection terminals 25a, 25b, 25c, 25d in the connection terminal group 25. Second ends of the LEDs 6a, 6b, 6c, 6d are connected to a power supply terminal V in the connection terminal group 25. The above stated connections are made when each of the input and output connectors 4 and 5 has a plurality of terminal receiving holes other than four (but not more than 30).

Operation is discussed below.

Figure 6:
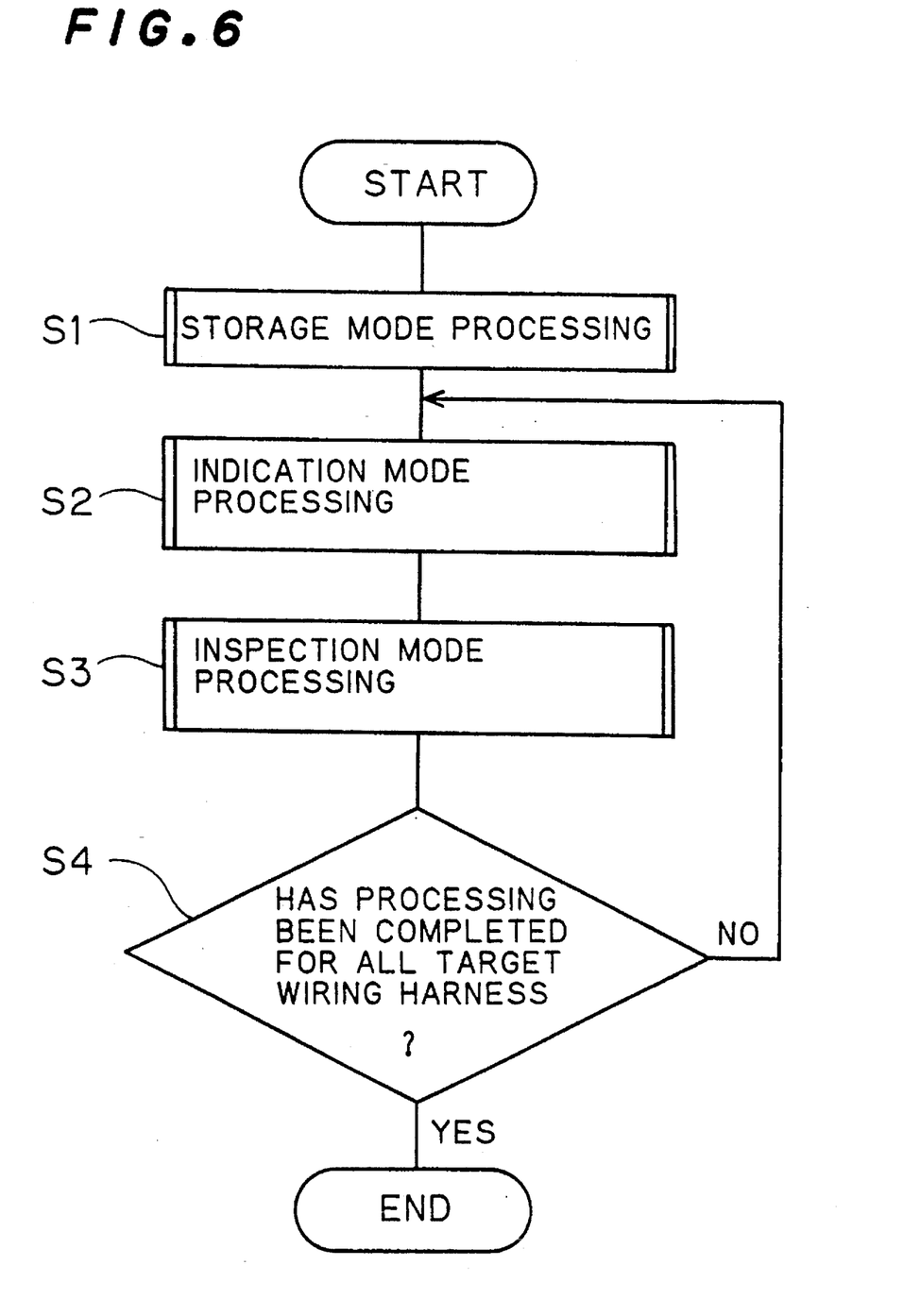
FIGS. 6 through 9 are flow charts for illustrating the operation of the preferred embodiment.

The entire operation is first described with reference to the flow chart of FIG. 6. As illustrated in FIG. 6, the processing in the storage mode is performed in which the reference data of the model wiring harness are stored (process step S1). Next, the processing in the indication mode is performed in which the insertion positions of the terminals on the second end of the target wiring harness are indicated (process step S2). Then, the processing in the inspection mode is performed in which the wiring harness to be inspected is inspected for correct connection of the connectors (process step S3). A determination is made as to whether or not the processing in the indication and inspection modes has been completed for all target wiring harnesses (process step S4). If the result of determination is NO, the flow returns to the process step S2. If the result of determination is YES, the operation is terminated.

Figure 7:
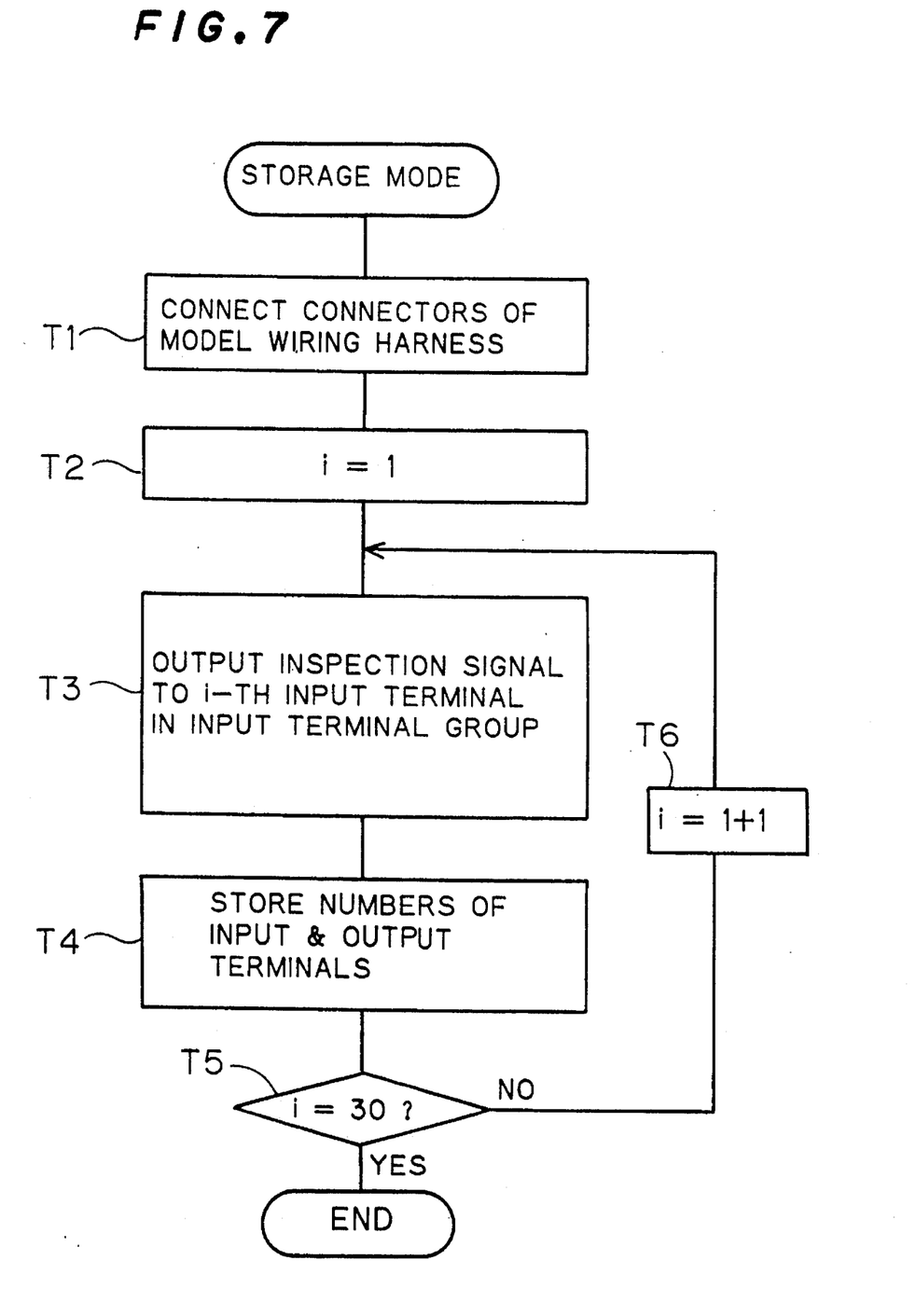

The storage mode processing is discussed below. Referring to FIG. 7, the connectors on the opposite ends of the model wiring harness are connected respectively to the connectors 4 and 5 of the work table 2, and the memory switch 18 is turned on (process step T1). Then the terminal number i which specifies the input terminal that is to output the inspection signal in the input terminal group 23 is set to 1 (process step T2). Under the control of the control portion 48 of the microcomputer 31, the signal output portion 38 outputs the inspection signal to the i-th input terminal in the input terminal group 23 through the interface 32 (process step T3). The terminal number of the output terminal in the output terminal group 24 through which the signal of the same level as the inspection signal is applied to the signal input portion 39 is detected and stored with the terminal number "i" of the input terminal receiving the inspection signal in the process step T3 as the reference data in the first memory portion 40 (process step T4). Then whether or not the number i reaches 30 is determined (process step T5). If the result of determination is NO, the number i is replaced with (i+1) (process step T6) and the flow returns to the process step T3. If the result of determination is YES, the collection and storage of the reference data are considered to have been completed, and the storage mode processing is terminated.

Figure 8:
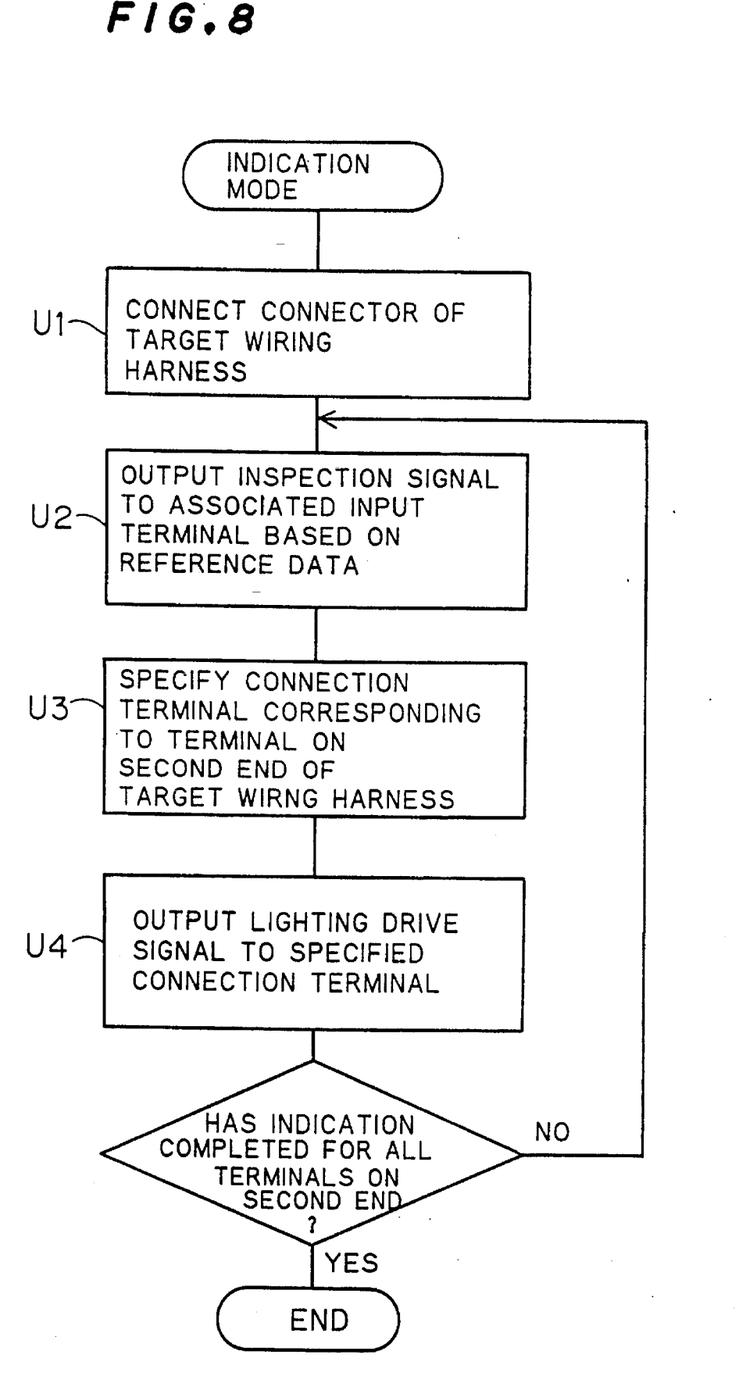

The indication mode processing is discussed below. Referring to FIG. 8, the first connector 11 on first end of the target wiring harness 10 (FIG. 1) is connected to the input connector 4 of the work table 2, and the second connector 12 to be connected to the second end of the target wiring harness 10 is connected to the output connector 5 (process step U1). Under the control of the control portion 48, the signal output portion 38 outputs the inspection signal to all of the input terminals having the input terminal numbers which are the reference data stored in the first memory portion 40 (process step U2). Then the terminals on the second end of the target wiring harness 10 are selected one by one and brought into contact with the earth plate 7 to specify a predetermined one of the connection terminals in the connection terminal group 25 in the above-mentioned manner (process step U3).

The lighting drive signal from the lighting and flashing drive portion 44 is applied to the specified connection terminal to light up the LED 6 connected to the specified connection terminal, thereby indicating a predetermined one of the terminal receiving holes of the second connector 12 connected to the output connector 5 (process step U4). The terminal selected in the process step U3 is inserted into the indicated terminal receiving hole of the second connector 12. Then, a determination is made as to whether or not the indication processing has been completed for all of the terminals on the second end of the target wiring harness 10 (process step U5). If the result of determination is NO, the flow returns to the process step U2. If the result of determination is YES, the indication mode processing is terminated.

Figure 9:
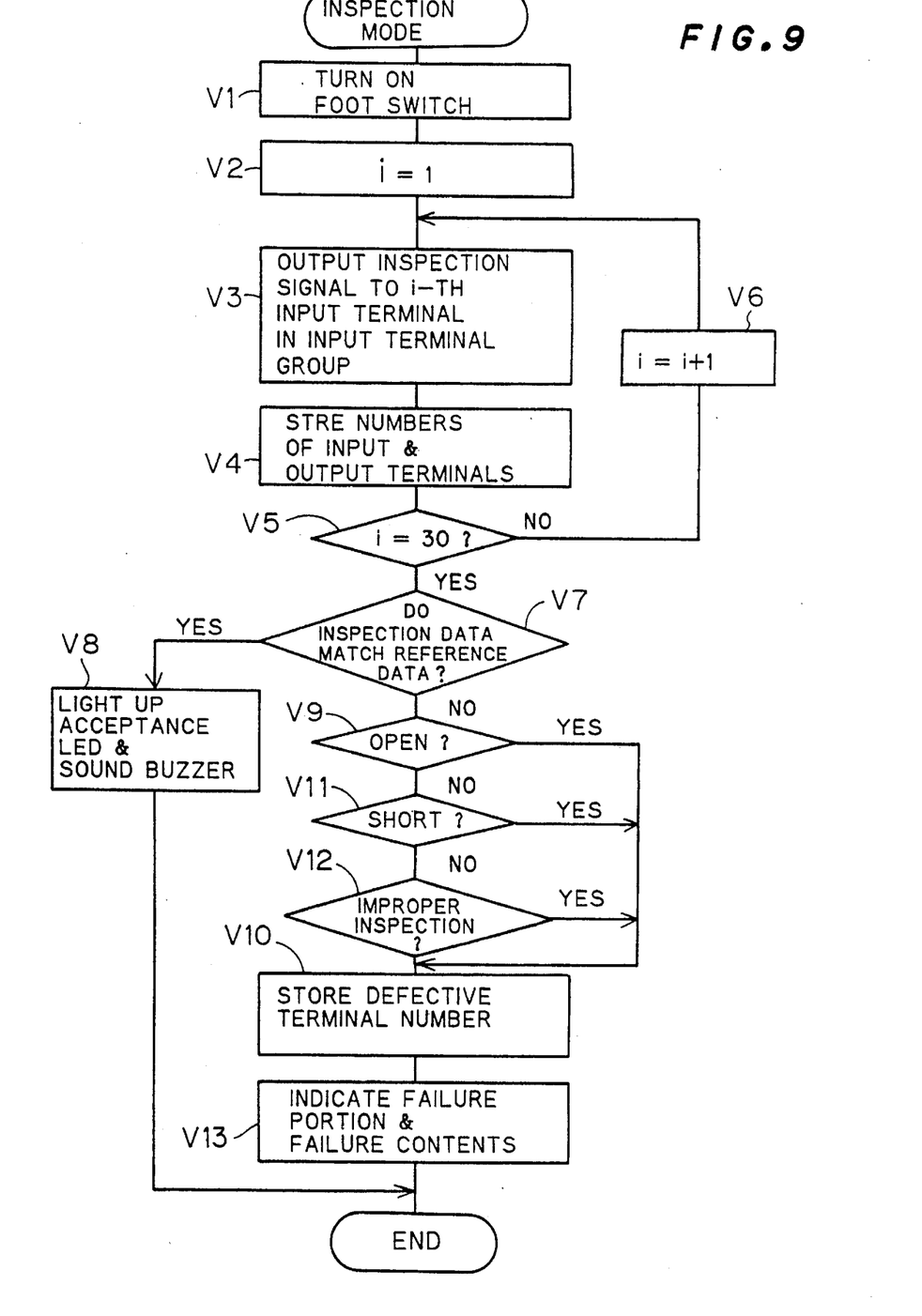

The inspection mode processing is described below. The wiring harness to be inspected is provided by mounting the second connector 12 to the target wiring harness 10 in the indication mode. Referring to FIG. 9, the foot switch 8 is turned on, with the connectors 11 and 12 on opposite ends of the wiring harness to be inspected being connected respectively to the connectors 4 and 5 of the work table 2 (process step V1). Then, like the storage mode processing, the terminal number i which specifies the input terminal that is to output the inspection signal in the input terminal group 23 is set to 1 (process step V2). Under the control of the control portion 48 of the microcomputer 31, the signal output portion 38 outputs the inspection signal to the i-th input terminal in the input terminal group 23 through the interface 32 (process step V3). The terminal number of the output terminal in the output terminal group 24 through which the signal of the same level as the inspection signal is applied to the signal input portion 39 is detected and stored with the terminal number "i" of the input terminal receiving the inspection signal in the process step V3 as the reference data in the second memory portion 41 (process step V4). Then, whether or not the terminal number i reaches 30 is determined (process step V5). If the result of determination is NO, the terminal number i is replaced with (i+1) (process step V6) and the flow returns to the process step V3.

On the other hand, if the result of determination is YES in the process step V5, the collection and storage of the inspection data of the wiring harness to be inspected are considered to have been completed, and the flow proceeds to the process step V7. The inspection data are compared with the reference data to determine if the complete match occurs (process step V7). If the result of determination is YES, that is, the complete match occurs, then the lighting drive signal is applied to the acceptance LED 20 from the lighting and flashing drive portion 44 under the control of the control portion 48 to light up the acceptance LED 20, and a buzzer drive signal is applied to the acceptance buzzer 35 from the buzzer drive portion 45 under the control of the control portion 48 to sound the buzzer 35, thereby indicating by both the acceptance LED 20 and buzzer 35 that the wiring harness to be inspected is acceptable (process step V8). After a lapse of two seconds, the acceptance LED 20 goes off and the buzzer 35 stops sounding, and the inspection mode processing is terminated.

If the result of determination is NO in the process step V7, that is, the complete match between the inspection data and reference data is not detected but the wiring harness to be inspected is defective, then examined is a portion of the inspection data which does not match the reference data, or the defective portion of the wiring harness to be inspected. Whether or not the failure is an open is determined (process step V9). If the result of determination is YES in the process step V9, the terminal number of the output terminal in the output terminal group 24 corresponding to the open terminal connected to the second connector 12 of the wiring harness to be inspected is stored in the third memory portion 43 (process step V 10).

If the result of determination is NO in the process step V9, whether or not the failure of the wiring harness to be inspected is a short is determined (process step V11). If the result of determination is YES in the process step V11, the flow proceeds to the process step V10 wherein the terminal number of the output terminal in the output terminal group 24 corresponding to the shorted terminal inserted in the second connector 12 of the wiring harness to be inspected is stored in the third memory portion 43. If the result of determination is NO in the process step V11, whether the failure contents of the wiring harness to be inspected are an improper insertion is determined as a result of comparison between the inspection data and reference data (process step V12). If the result of determination is YES in the process step V12, the flow proceeds to the process step V10 wherein the terminal number of the output terminal in the output terminal group 24 corresponding to the improperly inserted terminal connected to the second connector 12 of the wiring harness to be inspected is stored in the third memory portion 43. If the result of determination is NO in the process step V12, the failure contents of the wiring harness to be inspected are determined as neither open, short, nor improper insertion but other failures, and the flow proceeds to the process step V10 wherein the terminal number of the output terminal in the output terminal group 24 corresponding to the terminal with other failures connected to the second connector 12 of the wiring harness to be inspected is stored in the third memory portion 43.

Under the control of the control portion 48, the lighting and flashing drive portion 44 applies the flashing drive signal having a flashing pattern predetermined in accordance with the failure contents to the connection terminal in the connection terminal group 25 which has the same terminal number as the failure data stored in the third memory portion 43, thereby flashing the LED 6 receiving the flashing drive signal (process step V13). The flashing pattern indicates the defective terminal connected to the second connector 12 of the wiring harness to be inspected and the failure contents. Then the inspection mode processing is terminated.

The open is determined when all output terminals are low, including the output terminal which should go high in a normal condition in response to the high-level inspection signal from the input connector 4 of the wiring harness to inspected. The short is determined when any one of the cables of the wiring harness to be inspected is short-circuited and any one of the output terminals is high in addition to the output terminal which should go high in a normal condition in response to the high-level inspection signal from the input connector 4 of the wiring harness to be inspected. The improper insertion such that the inserted terminals are in transposed positions is determined when high is the output terminal other than the output terminal which should go high in a normal condition in response to the high-level inspection signal from the input connector 4 of the wiring harness to be inspected.

In this manner, the inspecting device body 1 and the work table 2 are provided separately and connected to each other by the single flexible printed wiring board 9. Thus, the connection of the inspecting device body 1 to the work table 2 located on a predetermined wiring harness assembly line provides for the reduction in rejection rate during the assembly of the wiring harnesses on the line as well as the final inspection of the wiring harnesses for acceptance or rejection.

When a plurality of wiring harness assembly lines are provided, a plurality of work tables 2 may be located in suitable positions on the respective assembly lines and the inspecting device body 1 may be connected only to the work table 2 on the required assembly line, thereby allowing the reduction in rejection rate during the assembly of the wiring harnesses on the assembly line as well as the final inspection of the wiring harnesses for acceptance or rejection. The inspecting device of the present invention exhibits its applicability particularly for the plurality of assembly lines. Additionally, only the size of the work table 2 may be set in accordance with the size and specifications of the wiring harnesses but the device body 1 itself may be small-sized.

The number of terminals in each terminal group of the inspecting device body 1 is 30 in the above stated preferred embodiment but is not limited thereto.

The light emitting elements are not limited to the LEDs.

While the invention has been described in detail, the foregoing description is in all aspects illustrative and not restrictive. It is understood that numerous other modifications and variations can be devised without departing from the scope of the invention.

We claim:

1. A wiring harness inspecting device for inspecting a plurality of terminals mounted on opposite ends of a plurality of cables of a wiring harness to be inspected for correct insertion into a plurality of corresponding terminal receiving holes of a connector, said wiring harness inspecting device comprising:

an inspecting device body, and a work table, said wiring harness inspecting device being operated in a storage mode, an indication mode, and an inspection mode, wherein, in said storage mode, there is provided a model wiring harness including a plurality of cables and a pair of model connectors mounted on opposite ends of said cables, and the insertion condition of terminals on opposite ends of said cables into terminal receiving holes of said pair of model connectors is stored as reference data, wherein, in said indication mode, there is provided a target wiring harness including a plurality of cables and a first connector mounted on a first end of said cables, and an indication of insertion of terminals on a second end of said cables of said target wiring harness into terminal receiving holes of a second connector to be connected is given on the basis of said reference data, and wherein, in said inspection mode, the terminals on the second end of said cables of said target wiring harness are inserted into the terminal receiving holes of said second connector indicated in said indication mode to provide a wiring harness to be inspected, and an inspection is made on the basis of said reference data to see if the insertion condition of said cables of said wiring harness to be inspected into the terminal receiving holes of said first and second connectors on opposite ends of said cables matches the insertion condition of said model wiring harness, said inspecting device body including:

an input terminal group having a plurality of input terminals;

a signal output portion for outputting an inspection signal to said input terminals in order;

an output terminal group having a plurality of output terminals;

a signal input portion for receiving a signal through said output terminals;

a connection terminal group having a plurality of connection terminals;

a reference data memory portion for storing therein the reference data indicative of the insertion condition of said model wiring harness in said storage mode;

a light emitting element lighting drive portion for outputting a lighting drive signal to a predetermined one of said connection terminals on the basis of said reference data in said indication mode;

an inspection data memory portion for storing therein inspection data indicative of the insertion condition of said wiring harness to be inspected in said inspection mode;

a comparing and determining portion for comparing said inspection data with said reference data in said inspection mode, said comparing and determining portion outputting an abnormal condition signal when a failure occurs in said inspection data; and a flashing drive portion for outputting a flashing drive signal to one of said connection terminals which corresponds to the failure portion in response to said abnormal condition signal in said inspection mode, said work table including:

an input connector connected to said input terminals in said input terminal group of said inspecting device body, said input connector being connected to one of said model connectors of said model wiring harness in said storage mode, to said first connector of said target wiring harness in said indication mode, and to said first connector of said wiring harness to be inspected in said inspection mode;

an output connector connected to said output terminals in said output terminal group of said inspecting device body, said output connector being connected to the other model connector of said model wiring harness in said storage mode, and to said second connector of said wiring harness to be inspected in said inspection mode;

a plurality of light emitting elements located adjacent respective terminal receiving holes of said output connector and connected to said connection terminals in said connection terminal group of said inspecting device body for flashing in response to said flashing drive signal in said inspection mode to indicate a failure and terminal insertion; and specifying means, upon selection of one of the terminals on the second end of said target wiring harness having said first connector connected to said input connector, for specifying one of said connection terminals to light up one of said light emitting elements adjacent the terminal receiving hole in said reference data which corresponds to said selected terminal.

2. The wiring harness inspecting device of claim 1, wherein when a failure occurs in said inspection data, said comparing and determining portion of said inspecting device body outputs said abnormal condition signal corresponding to the failure contents, said flashing drive portion of said inspecting device body outputs said flashing drive signal having a flashing pattern corresponding to the failure contents in response to said abnormal condition signal, and said light emitting elements of said work table flash in the flashing pattern of said flashing drive signal in said inspection mode.

3. The wiring harness inspecting device of claim 2, wherein said failure contents in said inspection data include an open in which at least one of the terminals on the second end of said cables of said wiring harness to be inspected is not inserted into the associated terminal receiving hole of said second connector, a short in which any one of said cables of said wiring harness to be inspected is shorted to at least one other cable, and an improper insertion in which at least one of the terminals on the second end of said cables of said wiring harness to be inspected is inserted into an incorrect one of the terminal receiving holes of said second connector.

4. A wiring harness inspecting method for inspecting a plurality of terminals mounted on opposite ends of a plurality of cables of a wiring harness to be inspected for correct insertion into a plurality of corresponding terminal receiving holes of a connector, said method comprising the steps of:

storing reference data in a reference data memory portion, there being provided a model wiring harness including a plurality of cables and a pair of model connectors mounted on opposite ends of said cables, said reference data being indicative of an insertion condition of terminals on opposite ends of cables of said model wiring harness into terminal receiving holes of said pair of model connectors;

giving an indication on the basis of said reference data stored in said storing step, there being provided a target wiring harness including a plurality of cables and a first connector mounted on a first end of said cables, said indication being representative of the insertion of terminals on a second end of said cables of said target wiring harness into terminal receiving holes of a second connector to be connected; and inspecting a wiring harness to be inspected, said inspecting step including the steps of: forming said wiring harness to be inspected by inserting the terminals on the second end of said cables of said target wiring harness into the terminal receiving holes of said second connector indicated in said indicating step; providing inspection data indicative of an insertion condition of said cables of said wiring harness to be inspected into the terminal receiving holes of said first and second connectors mounted on the opposite ends of said cables; and comparing said inspection data with said reference data stored in said storing step to indicate the occurrence of a failure if the failure occurs in said inspection data.

5. The wiring harness inspecting method of claim 4, wherein when a failure occurs in said inspection data, a portion and contents of the failure are indicated.

6. The wiring harness inspecting method of claim 5, wherein said indicated failure contents include an open in which at least one of the terminals on the second end of said cables of said wiring harness to be inspected is not inserted into the associated terminal receiving hole of said second connector, a short in which any one of said cables of said wiring harness to be inspected is shorted to at least one other cable, and an improper insertion in which at least one of the terminals on the second end of said cables of said wiring harness to be inspected is inserted into an incorrect one of the terminal receiving holes of said second connector.

* * * * *